United States Patent [19]

Pressley

[11] Patent Number: 4,484,334
[45] Date of Patent: Nov. 20, 1984

[54] OPTICAL BEAM CONCENTRATOR
[75] Inventor: Robert J. Pressley, Cupertino, Calif.
[73] Assignee: Allied Corporation, Morristown, N.J.
[21] Appl. No.: 322,125
[22] Filed: Nov. 17, 1981
[51] Int. Cl.³ .............................................. H01S 3/08
[52] U.S. Cl. ..................................... 372/101; 372/99;
350/601; 350/619; 350/628; 350/612
[58] Field of Search ........................... 372/41, 99, 101;
350/292, 294, 296, 299, 310; 126/439

[56] References Cited
U.S. PATENT DOCUMENTS

| 3,645,606 | 2/1972 | La Vantine | 350/292 |
| 3,826,561 | 7/1974 | Gregg | 350/294 |
| 4,195,913 | 4/1980 | Dourte et al. | 350/292 |
| 4,289,380 | 9/1981 | Tucker | 350/292 |
| 4,320,164 | 3/1982 | Nicolas et al. | 350/292 |

FOREIGN PATENT DOCUMENTS 2012065A 7/1979 United Kingdom ................ 350/292
2062282 5/1981 United Kingdom .

OTHER PUBLICATIONS

Ream; "A Convex Beam Integrator" Laser Focus, vol. 15, No. 11, Nov. 1979, pp. 68–71.

Primary Examiner—William L. Sikes
Assistant Examiner—Léon Scott, Jr.
Attorney, Agent, or Firm—James Riesenfeld; Gerhard H. Fuchs

[57] ABSTRACT

An optical beam concentrator divides and redirects an incident beam to provide uniform irradiation along the length of a narrow rectangular area. The beam concentrator may form a part of an apparatus for laser irradiation of materials. The apparatus comprises a laser, a beam concentrator, and a support for the material being irradiated. Depending on the system parameters, the apparatus is particularly useful for gettering defects in semiconductor device fabrication or other materials processing applications.

12 Claims, 8 Drawing Figures

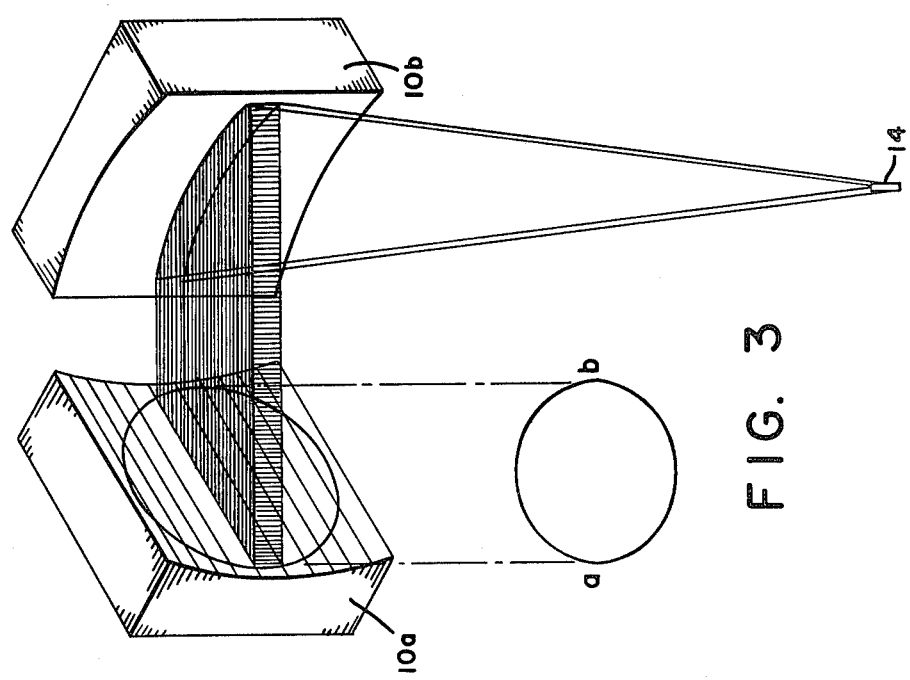
FIG. 3
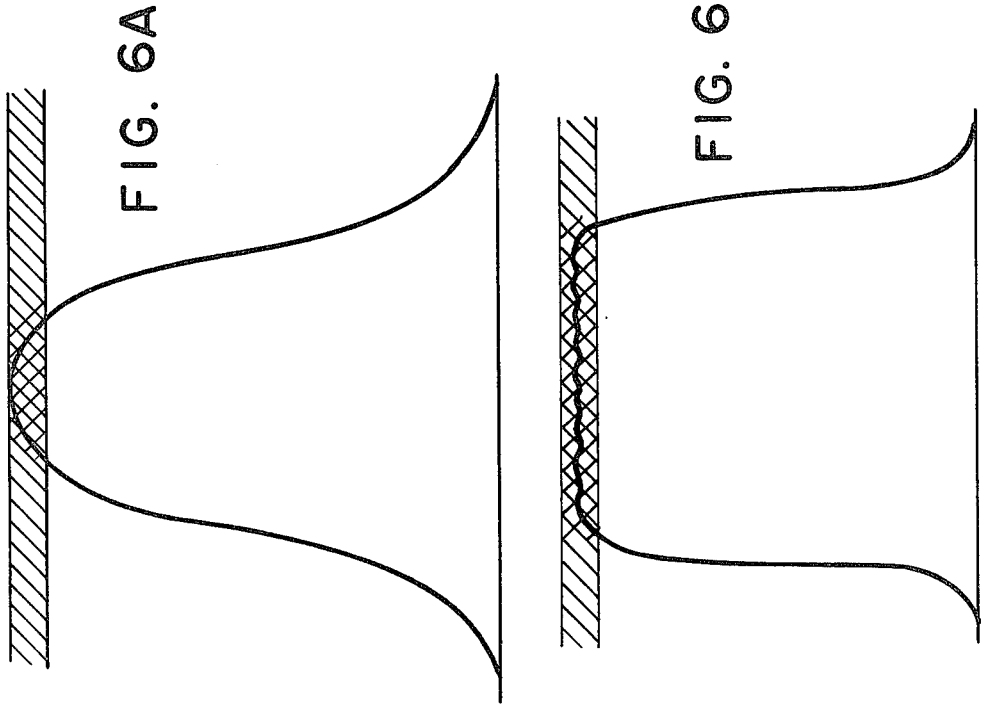
FIG. 6A
FIG. 6B

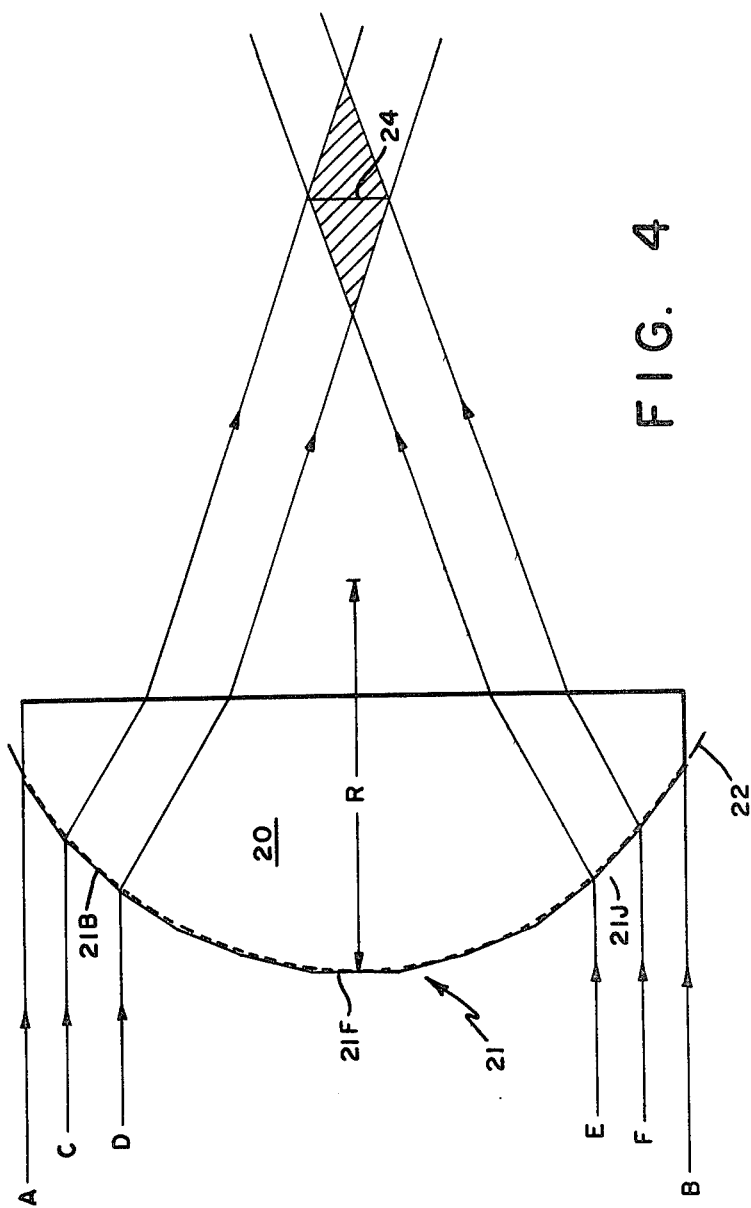

OPTICAL BEAM CONCENTRATOR

DESCRIPTION

1. Field of the Invention

This invention relates to an optical device for providing an intense line image having uniform power density along its length. The device is particularly useful in an apparatus for laser treatment of semiconductors.

2. Description of the Prior Art

During the fabrication of a semiconductor device, such as an integrated circuit, unwanted defects are generated in the bulk of the semiconductor near the active surface region. These defects degrade device performance and reduce yield of acceptable devices. At elevated temperatures defects become more mobile and can travel to regions of high strain field. If a strain field is deliberately created away from the active surface of a device, then, during a high temperature cycle, defects can be trapped there and prevented from interfering with device performance. Among the techniques that have been used to form the requisite strain field has been scanning a laser beam over the back surface (or other "distant" area) to induce lattice damage and strain. That technique has been disclosed in U.S. Pat. No. 4,131,487, issued Dec. 26, 1978, to Pearce et al.; U.S. Pat. No. 4,257,827, issued Mar. 24, 1981, to Schwuttke et al.; and Burggraaf, Semiconductor International, September, 1980, page 52. These prior art laser gettering techniques utilize a nominally symmetrical beam area; generally, a substantially circular spot. Thus, if the back surface damage is to have the form of a continuous line, a great many overlapping spot exposures are required.

An alternative gettering technique that has been disclosed involves thermal diffusion of dopants into the semiconductor bulk from the back surface, thereby creating lattice distortion. For example, Petroff et al., U.S. Pat. No. 3,997,368, issued Dec. 14, 1976, disclose a process for gettering stacking faults by forming a stressed layer on the back surface of a wafer, preferably preceded by thermally diffusing phosphorus into the back surface.

Another process that has been accomplished with lasers is dopant diffusion. In preparing n-type and p-type junctions, dopants that had been deposited or spun on semiconductor wafer surfaces were diffused into the bulk by exposing the wafers to suitable laser beams. This technique has been disclosed by Burggraaf, op. cit., p. 54. Laser-activated dopant diffusion techniques of the prior art have also suffered from small beam size, which necessitates a great many exposures in order to expose a substantial area of the wafer.

An elongated beam with uniform intensity along its length would provide advantages over circular spots for laser-induced surface damage and for laser-induced dopant diffusion.

Several laser beam shaping techniques were described by S. L. Ream in Laser Focus, November, 1979, p. 68. Among the optical devices he describes for use with $CO_2$ lasers in hardening of steels are convex and concave beam integrators that consist of copper blocks having a large number of carefully positioned flat facets either turned in or attached to them. The beam integrator yields a flattened laser output profile, which corresponds to enhanced uniformity of laser intensity on the work surface. He includes semiconductor annealing among potential application areas for beam integrators.

Among the optical integrators described by Ream are the types disclosed by Dourte et al., in U.S. Pat. No. 4,195,913. They accomplish optical integration by the use of a plurality of reflective segments. These segments are positioned to divide a beam into a plurality of parts and reflect the various parts so that they intersect at a target. Among the configurations disclosed for the reflective segments is one in which square segments are positioned tangent to an imaginary cylindrical surface to produce a long narrow rectangular area of optical integration. Fabrication of the integrators disclosed by Dourte et al. is difficult and expensive, and beam uniformity is reduced by discontinuity and diffraction at the many segment edges.

Orthogonal cylindrical lenses for successive one-dimensional beam expansion were disclosed by Glenn, in U.S. Pat. No. 3,877,777.

Arrays of rectangular elementary mirrors for concentrating solar radiation were disclosed by Devin et al. in U.S. Pat. No. 4,148,564. Among the configurations they disclose is an array of rectangular plane mirrors arranged along a portion of a cylinder.

SUMMARY OF THE INVENTION

In accordance with the present invention, an optical beam concentrator is provided. The beam concentrator comprises a segmented and a non-segmented cylindrical optical element, mounted with their cylindrical axes substantially at right angles to each other and oriented so that the elements divide a light beam incident on a first element into a plurality of parts and redirect the parts to intersect to form a substantially rectangular area of substantially uniform power density along its length at a predetermined distance from the second element.

As used in this specification and the appended claims, "light" includes electromagnetic radiation throughout the range from ultraviolet to infrared. The term "concentrator" refers to an optical device that redirects radiation incident on it in such a way as to provide uniform power density along one dimension. Since the resultant "line" image necessarily has a finite width, we refer below to a substantially rectangular area or a line interchangeably.

The beam concentrator of this invention is particularly suitable for use in an apparatus for exposing material to a substantially rectangular laser beam having a substantially uniform power density along its length. The apparatus comprises, in combination, a laser, whose output beam is directed to the beam concentrator to divide and redirect the laser beam, and means for supporting the material. An alexandrite laser is a preferred source.

The apparatus of the present invention is particularly useful for gettering defects in semiconductor devices by causing damage on a non-active surface (NAS) or by causing a dopant material to diffuse into a semiconductor from an NAS.

Compared with apparatus of the prior art, the alexandrite laser system provides a wavelength range that is particularly well suited for use with silicon. The system also has advantages of long pulse duration and high average power.

BRIEF DESCRIPTION OF THE DRAWINGS

FIG. 3 depicts a reflective beam concentrator.

FIG. 4 is a side view of a segmented element of a refractive beam concentrator.

FIG. 6 illustrates the improved uniformity of beam intensity achieved using a beam concentrator.

DETAILED DESCRIPTION OF THE INVENTION

Uniform irradiation over the length of a rectangular area is necessary or desirable in a variety of applications, such as vaporizing materials for vacuum deposition and concentrating solar energy for electric power generation. The beam concentrator of the present invention provides uniform irradiation using two cylindrical optical elements, one segmented and the other non-segmented (i.e. conventional cylindrical element). The two elements may be arranged with either one first. If the segmented cylindrical optical element (SCOE) is first, it receives an incident beam, divides the beam into a plurality of parts, and redirects the beam toward the second element. The second element, whose cylindrical axis is perpendicular to that of the first element, focuses the parts to intersect on an area that is perpendicular to the beam direction. The result is the same if the non-segmented cylindrical optical element (NCOE) is first.

The use of lasers in semiconductor processing applications has been limited not only by an inability to provide uniform irradiation, but also by the shortcomings of lasers emitting in the deep red and near infrared region of the spectrum, which are particularly useful for those applications. An embodiment of the present invention addresses these problems by using an alexandrite laser to generate a beam whose wavelength may be anywhere in the range from about 700 nm to about 830 nm. The laser beam is first directed to a concentrator, which divides and redirects the beam, and is then incident on the work material.

Figure 1:
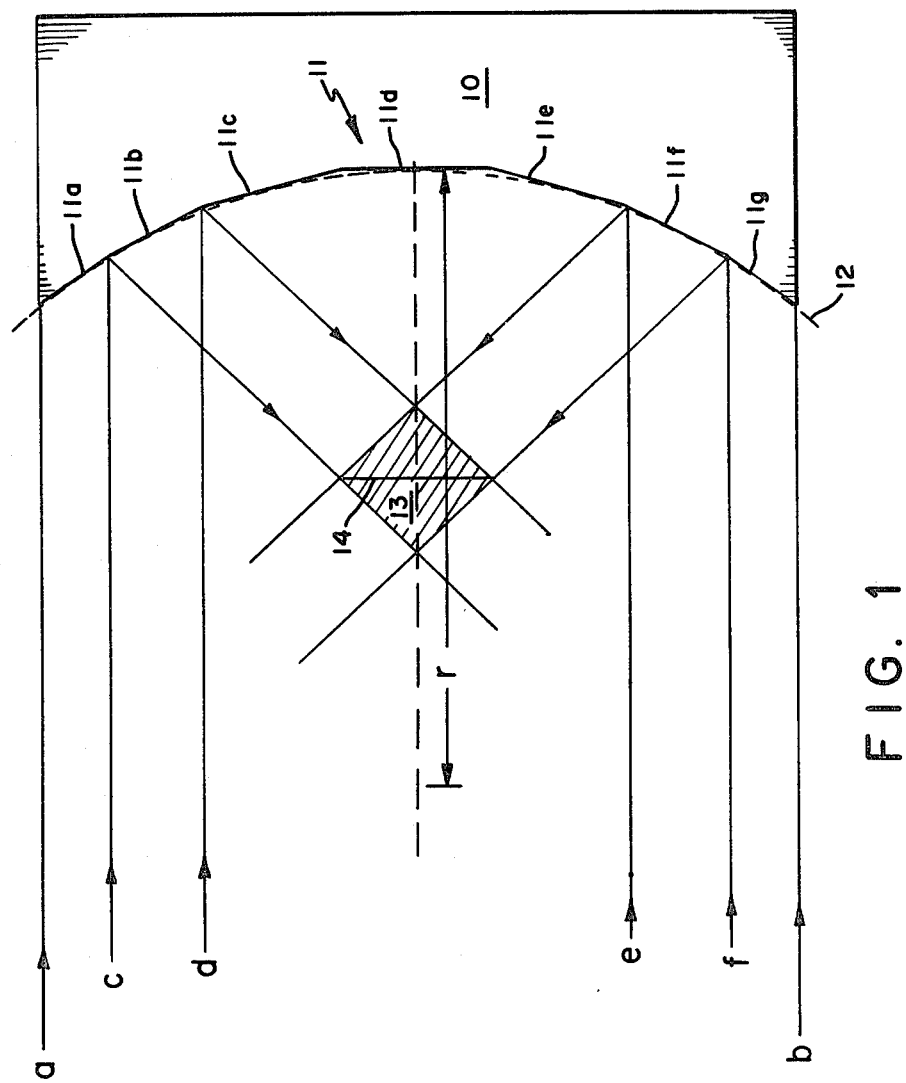
FIG. 1 is a side view of a segmented element of a reflective beam concentrator of the present invention.

In one embodiment of the optical beam concentrator of the present invention, the SCOE comprises a plurality of reflective segments. The principle of operation of a reflective SCOE can be understood with reference to FIG. 1. FIG. 1 depicts a side view of such an element 10, on which is incident a collimated light beam, defined by parallel rays a and b, parallel to the beam direction. We assume throughout that all the rays are paraxial; i.e., they make very small angles with the axis and lie close to the axis throughout the distance from object to image. The beam may, but need not, have a circular cross section in a plane normal to the beam direction. As is clarified in the perspective view shown in FIG. 2, the reflective front surface 11 of element 10 comprises seven rectangular segments 11a–11g. The segments are each tangent to an imaginary circular cylinder 12 of radius r. In general, the beam intensity is not uniform over its extent. However, the intensity variations over parts of the beam, for example cd and ef, are less than the variation over the larger distance ab. Reflective segments 11b and 11f redirect beam segments cd and ef, respectively, to intersect over a volume in space that is normal to the plane of the paper and whose projection on the plane of the paper is shown as lined area 13. Similarly, each reflective segment, 11a, 11c, . . . 11g, reflects the part of the beam incident on it to intersect the other reflected beams in rectangular area 14, located a distance r/2 from central segment 11d and having the same size as central segment 11d.

In a typical embodiment of the present invention, central segment 11d and area 14 are rectangles 3 mm wide and 300 mm long. The resultant intensity variation over the width (e.g., 3 mm dimension) of irradiated area 14 is far less than the variation over the incident beam ab. A greater number of reflective segments reduces the intensity variation; however, it also reduces the irradiated area. Furthermore, interference and diffraction effects, which are ignored throughout, can introduce significant nonuniformity if segment width becomes very small. In a practical situation, an application will dictate a minimum permissible irradiated area and a maximum permissible intensity variation, which, in turn, will dictate the dimensions of the element and the number and size of the segments.

In order that the reflected beam from each segment provide the same image size, segment width must decrease away from central segment 11d. It can be shown that a segment whose normal makes an angle $\theta$ with the axis should have a width of $w \cos 2\theta / \cos \theta$, where w is the width of the central segment. However, for paraxial rays, the variation in width may be negligible and, depending on the uniformity requirements, it may be expedient to make all the segments of equal width.

For simplicity of understanding, beam ab is shown in FIG. 1 as being normal to central segment 11d. In practice, however, irradiated area 14 typically coincides with a part of the work surface of a target being irradiated. The target then would block the central portion of the beam. In practice, therefore, the incident beam is not normal to the central segment.

Figure 2:
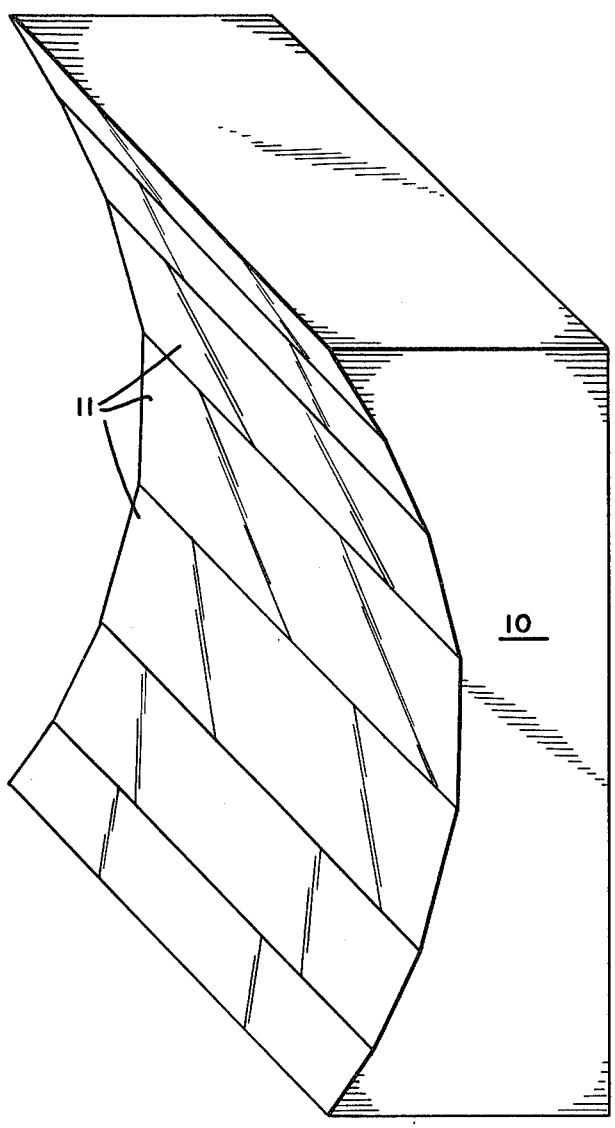
FIG. 2 is a perspective view of the element of FIG. 1.

In FIGS. 1 and 2, the SCOE 10 is shown to include seven rectangular reflective segments 11; in practice, there would generally be at least that many segments. Reflective segments 11 are shown to be an integral part of element 10. Alternatively the segments can be mirrors adhered to a cylindrical concave surface. In any case, reflective surfaces 11 are coated with a material or materials that are durable and that have high reflectance in the wavelength range of intended use. These materials, well known in the optical coating art, include various metals, such as silver or gold, with a transparent protective coating, if necessary.

FIG. 3 shows both elements of a reflective beam concentrator. The NCOE 10b is positioned with its axis substantially at right angles to that of the SCOE 10a. An incident light beam ab has a generally circular cross section in a plane normal to the beam direction. Reflective elements 10a and 10b redirect and concentrate the beam so that it is incident on a planar work material in a substantially rectangular area 14 of substantially uniform intensity along its length. In a typical embodiment, element 10a is formed of a series of reflective segments about 3 mm wide × 300 mm long and would alone form an irradiated area of that size, with uniform power density along the 3 mm width. Element 10b focuses the rectangle into a narrow rectangle, or line, oriented at right angles to the original rectangle. Thus the 3 mm dimension, along which the intensity is uniform, is unchanged but becomes the length of the line. The 300 mm dimension is focused to 0.1 mm, the width of the line. Power density is not necessarily uniform across the line width.

In an alternative embodiment of a beam concentrator, the elements are transparent. A side view of an SCOE 20 of such a concentrator is shown in FIG. 4. In analogy to the reflective beam concentrator element shown in FIG. 1, an incident parallel beam AB, of generally circular cross section, is incident on refractive SCOE 20, which comprises 11 substantially rectangular segments 21A–21K. The segments are each tangent to an imaginary cylinder 22, having a radius R. As before, the analysis is limited to paraxial rays. FIG. 4 depicts parts CD and EF of beam AB redirected by segments 21B and 21J, respectively. In fact, each segment redirects a part of beam AB, and all the resultant beams are incident on a rectangular area 24, which extends normal to the plane of the paper and is the same size as central segment 21F. Depending on the index of refraction of element 20, the distance from area 24 to central segment 21F may be about 2R.

Figure 5:
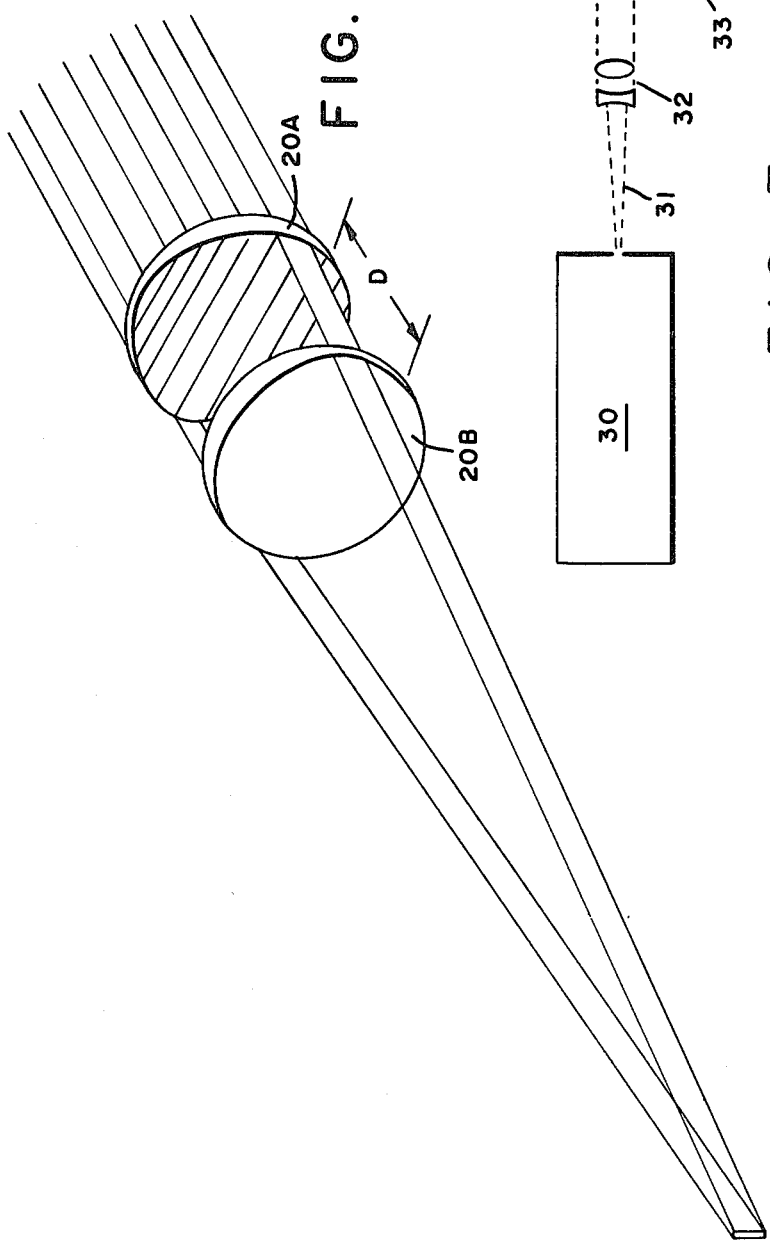
FIG. 5 depicts a refractive beam concentrator.

FIG. 5 shows a perspective view of both elements of a refractive beam concentrator. The long direction of the rectangular segments of element 20A is at right angles to the cylindrical axis of NCOE 20B. The elements are separated by a distance D, with element 20B closer to target 24. The imaginary cylinder to which the segments of element 20A are tangent has a focal length which is longer by the length D than the focal length of element 20B.

Standard optical materials are suitable for the elements of the refractive beam homogenizer, with low absorption of the particular light to be used a primary concern. If desirable or necessary, antireflection coatings may be applied to the elements.

Refractive beam concentrators have two drawbacks compared with reflective. Depending on the wavelength of the light source and absorption characteristics of the concentrator material, there may be substantial absorption and consequently reduced intensity. In addition, if the light source is not monochromatic, chromatic aberration reduces beam uniformity on the target.

The main advantage of a refractive beam concentrator is the fact that the target may be on the axis, which reduces optical aberrations and permits simpler arrangement of the concentrator and target. When, in addition, an alexandrite laser is the light source, ordinary optical glass is adequate as a concentrator material and chromatic aberration is, of course, not a problem.

An alternative to beam concentrators comprising two reflective or two transparent elements is one comprising an element of each type. Such a combination concentrator would then have a combination of the advantages and disadvantages of the two types of elements.

An optical beam concentrator is well suited for use in an apparatus for laser treatment of semiconductors. The beam homogenizer permits multimode operation of the laser, with greater power output, instead of the $TEM_{oo}$ mode, which the apparatuses of the prior art were limited to. An alexandrite laser is particularly well suited for use in such an apparatus. An alexandrite laser is disclosed in U.S. Pat. No. 4,272,733, and the disclosure of that patent is incorporated herein by reference. The active material is synthetic alexandrite, which is Cr-doped $BeAl_2O_4$ having the chrysoberyl structure. The laser may be operated in either the pulsed or CW mode, pumped with either a coherent or incoherent source, and it may be Q-switched and/or modelocked. The output wavelength is continuously selectable in the range from about 700 nm to 830 nm. Alternatively, if a conventional tuning element such as a birefringent filter is incorporated in the laser, the output wavelength may be tuned to any wavelength in that range. By suitable choice of laser parameters, output power may be anywhere in the range from 0 to 70 watts. Pulse durations in the range from 1–1000 ns may be provided at frequencies up to 40 $s^{-1}$.

Preferably, the laser beam passes first to a beam expander, which may be of a conventional type, well known in the art. The beam expander enlarges and collimates the laser beam and facilitates alignment of the beam.

The laser beam is then incident on a beam concentrator, which converts the beam to one having a substantially uniform power density along the length of a narrow rectangle perpendicular to the direction of beam travel at the work surface. Here and in the description that follows, it is convenient to assume that the work surface is a plane that includes the rectangle, but that is not a requirement.

FIG. 6A depicts the Gaussian spatial intensity variation that typifies a laser beam ($TEM_{oo}$) incident on the work surface of a materials processing apparatus when no beam concentrator is used. The lined area shows the range of fluence usable for the particular application and the crosshatching shows the spatial region over which the fluence is in the required range. FIG. 6B depicts the intensity variation along the image line when a beam concentrator of this invention is used. Although the two graphs of beam intensity are idealized and not meant to be quantitatively accurate, it is clear that the spatial region over which appropriate fluence is provided is far greater when a beam concentrator is used.

If, as is almost invariably the case, the beam on the surface, the laser beam must be moved relative to the material in order to effect appropriate exposure. In principle, the beam could be scanned across a stationary material. In practice, it is generally more convenient to use a support adapted to move the material in a plane substantially perpendicular to the direction of the incident beam.

An important application of the present apparatus is semiconductor processing. In particular, the apparatus of the present invention is particularly well adapted for accomplishing two different gettering techniques. The first technique involves controlled damaging of a nonactive surface (NAS), such as the back surface of a semiconductor wafer. This process is described in detail in U.S. Pat. Nos. 4,131,487 and 4,257,827. The present apparatus accomplishes the process more efficiently, because it provides a line exposure of uniform power density, rather than the spot provided with the prior apparatuses. Consequently, fewer exposures are required to provide the desired line pattern of damage on the surface. Typically, beam energy density in the range from about 10–50 $J/cm^2$ provides the surface damage desired.

A second gettering technique that can be accomplished advantageously with the present apparatus involves driving dopant atoms into a wafer from an NAS. The dopant atoms cause lattice strain that traps mobile deflects which would otherwise interfere with device performance. Beam energy density in the range from about 1–5 $J/cm^2$ is preferred for this gettering technique. The technique is described in greater detail in copending application of R. J. Pressley, Laser Process for Gettering Defects in Semiconductor Devices U.S. Ser. No. 322,123, filed 11/17/81, now U.S. Pat. No. 4,415,373, issued 11/15/83, and the disclosure of that application is incorporated herein by reference.

Both gettering techniques are preferably accomplished with an apparatus that includes an alexandrite laser, because the deep red to near infrared output wavelengths of that laser are more strongly absorbed by silicon, GaAs, and other semiconductor device materials than are the longer wavelengths emitted by YAG and other infrared lasers.

Figure 7:
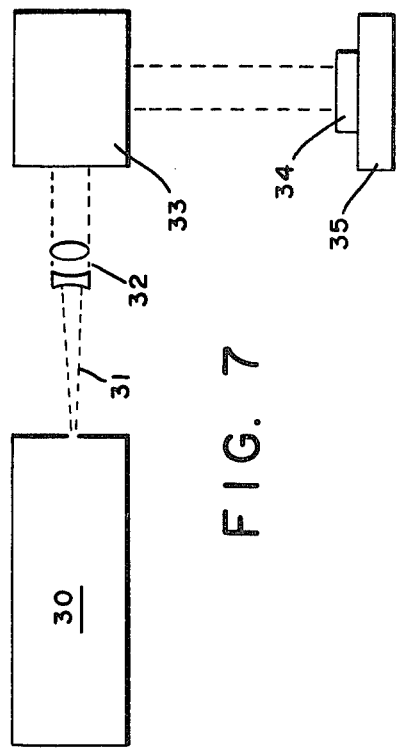
FIG. 7 is a schematic illustration of a materials-processing apparatus employing a beam concentrator of the present invention.

FIG. 7 depicts a schematic of a laser apparatus of the present invention. Laser 30, optionally equipped with a Q-switch and/or tuning element (not shown) of conventional design well known in the art, generates a beam 31, which impinges on optional beam expander 32 and is directed to beam concentrator 33. Beam concentrator 33 divides the beam into parts, and the parts intersect at the surface of work material 34, which is mounted on support 35. Support 35 may include means, such as an X-Y motion system, for moving the work material 34 in a plane perpendicular to the incident beam.

I claim:

1. An optical beam concentrator comprising both a segmented and a non-segmented cylindrical optical element oriented so that the elements divide a light beam incident on a first element into a plurality of parts and redirect the parts to intersect to form a substantially rectangular area of substantially uniform power density along its length at a predetermined distance from the second element.

2. The beam concentrator of claim 1 in which the non-segmented element is reflective.

3. The beam concentrator of claim 1 in which the segmented optical element comprises reflective segments.

4. The beam concentrator of claim 3 in which the reflective segments are substantially rectangular, are in contact along their long dimension, and have short dimensions that decrease monotonically away from a central rectangle.

5. The beam concentrator of claim 1 in which the non-segmented element is transparent.

6. The beam concentrator of claim 1 in which the segmented optical element comprises transparent segments.

7. An apparatus for exposing material to a laser beam having a substantially uniform power density along its length comprising, in combination:
 a laser, whose output beam is directed to
 the beam concentrator of claim 1, 2, 3, 4, 5, or 6 to divide and redirect the laser beam, and
 means for supporting material for exposure.

8. The apparatus of claim 7 in which the laser is an alexandrite laser.

9. The apparatus of claim 7 in which the laser includes means for Q-switching the laser.

10. The apparatus of claim 7 in which the laser includes means for tuning the wavelength of the laser beam.

11. The apparatus of claim 7 in which the laser includes a beam expander to enlarge the spatial extent of the laser beam prior to its passing to the concentrator.

12. The apparatus of claim 7 in which the means for supporting the material further comprises means for moving the material in a plane substantially perpendicular to the direction of the laser beam incident on the material.

* * * * *